United States Patent
Hakey et al.

(10) Patent No.: US 6,281,576 B1
(45) Date of Patent: Aug. 28, 2001

(54) METHOD OF FABRICATING STRUCTURE FOR CHIP MICRO-JOINING

(75) Inventors: Mark C. Hakey, Fairfax, VT (US); William Hsioh-Lien Ma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/334,801

(22) Filed: Jun. 16, 1999

(51) Int. Cl.[7] ................................................ H01L 23/34
(52) U.S. Cl. ........................ 257/723; 257/724; 438/106; 438/107; 438/455
(58) Field of Search ................................. 438/107, 108, 438/109, 455, 106, 618, 612, 456; 257/723, 724, 725

(56) References Cited

U.S. PATENT DOCUMENTS

| | | | |
|---|---|---|---|
| 4,794,092 | 12/1988 | Solomon | 437/51 |
| 4,797,508 | 1/1989 | Chant | 174/68.5 |
| 4,853,277 | 8/1989 | Chant | 428/209 |
| 5,286,335 | 2/1994 | Drabik et al. | 156/631 |
| 5,663,101 * | 9/1997 | Cronin | 438/637 |
| 5,729,896 | 3/1998 | Dalal et al. | 29/840 |
| 6,026,564 * | 2/2000 | Wang et al. | 29/830 |
| 6,077,725 * | 6/2000 | Degani et al. | 438/108 |
| 6,110,760 * | 8/2000 | Medlen et al. | 438/107 |

* cited by examiner

Primary Examiner—Don Wong
Assistant Examiner—Tuyet T. Vo
(74) Attorney, Agent, or Firm—DeLio & Peterson, LLC; Peter W. Peterson; William D. Sabo

(57) ABSTRACT

A structure and process for joining semiconductor components. The present invention allows the flexibility of fabricating electronic components, or semiconductor chip structures, to a common point and electrically joining the different parts together at a back end level, or to a metal wiring level, to complete circuit functionality. Different combinations of front end of the line device chips may be readily joined to a common back end of the line device using a small electrical connection to form a small semiconductor chip package. Instead of packaging different groups of semiconductor chips onto different substrates and then electrically connecting each substrate together for circuit and component functionality, each group of chips can be formed on a single substrate and electrically joined on a back end wafer. These electrically connected and combined groups of chips becomes, for all practical purposes, one chip. The micro-joining of these electronic devices enhances "chip" electrical performance due to reductions in resistance and shorter wiring lengths between devices.

21 Claims, 2 Drawing Sheets

METHOD OF FABRICATING STRUCTURE FOR CHIP MICRO-JOINING

BACKGROUND OF THE INVENTION

1. Field of the Invention

The present invention relates generally to electronic semiconductor package interconnections, and more particularly to a method and structure for joining electronic semiconductor chip packages.

2. Description of Related Art

As semiconductor devices become smaller and denser, it becomes increasingly important to join two semiconductor parts together, i.e., chip to chip, or chip to substrate, to reduce delay and improve performance. While existing processes can be used to join semiconductor chips having large feature sizes to a substrate, current technology does not provide an adequate method to make extremely small solder connections which can be used at a very early back end of the line ("BEOL") levels and later wiring levels. Controlled collapse chip connection ("C4") technology can be employed for first level assembly of chips on ceramic carriers, as disclosed in U.S. Pat. No. 5,729,896. However, C4 technology and ball limiting metallurgy is for much larger scale connections and feature sizes, rather than the micro connections of the present invention.

Bearing in mind the problems and deficiencies of the prior art, it is therefore an object of the present invention to provide a method and structure to join semiconductor parts together.

Another object of the present invention is to provide a method and structure to join together semiconductor parts with extremely small electrical connections.

A further object of the present invention is to provide a method and structure to fabricate semiconductor chips and substrates separately and then join them together for functionality.

It is yet another object of the present invention to provide a method for joining multiple chips from different technologies together via a common back end for group functionality.

It is yet still another object of the present invention to provide a method and structure for joining semiconductor parts together which allows rework capability.

SUMMARY OF THE INVENTION

The above and other objects and advantages, which will be apparent to one of skill in the art, are achieved in the present invention which is directed to, in a first aspect, a method of electrically connecting electronic semiconductor components. The method comprises the steps of providing a first semiconductor substrate comprising a plurality of layers, at least one of the layers comprising a first electronic semiconductor component. The first semiconductor substrate preferably has at least one conductive column formed thereon, with the column being electrically connected to the first electronic semiconductor component. In the preferred embodiment the first semiconductor substrate comprises a first electrically insulating layer over the first electronic component, a first electrically conductive layer over the first insulating layer and a second electrically insulating layer over the first conductive layer. Preferably, the column is formed within the second insulating layer and electrically joined to the second conductive layer. In the preferred embodiment the first electronic semiconductor component comprises a first semiconductor layer with at least one front end of the line device comprising at least one semiconductor integrated circuit, and a second semiconductor layer with at least one partial back end of the line device. It is preferred that the second semiconductor layer have at least one electrically conductive stud extending therefrom, the stud being adapted to provide an electrical connection to the second semiconductor layer.

The method also includes providing a second semiconductor substrate comprising a plurality of layers, at least one of the layers comprising a second electronic semiconductor component. It is preferred that the second substrate have at least one via formed therein, the via be adapted to receive the column and provide an electrical connection to the second electronic semiconductor component. In the preferred embodiment the second semiconductor substrate comprises a third electrically insulating layer over the second electronic semiconductor component, a second electrically conductive layer over the third insulating layer, and a fourth electrically insulating layer over the second conductive layer. In the preferred embodiment, the second electronic semiconductor component comprises a back end of the line device and may be a wiring substrate. It is preferred that the via is formed in the fourth insulating layer.

The preferred method also comprises inserting the column into the via to join the first semiconductor substrate to the second semiconductor substrate and electrically connecting the first electronic semiconductor component to the second electronic semiconductor component.

In the preferred embodiment, the conductive column comprises a first layer of a conductive material covered by a layer of a heat flowable electrically conductive material having a lower melting point than the first layer of a conductive material. It is preferred that the first layer of conductive material is plated copper and the heat flowable conductive material is plated solder. In the preferred embodiment, the first electronic semiconductor component is electrically connected to the second electronic semiconductor component by heating the joined structure sufficiently to flow the heat flowable conductive material.

In another aspect, the present invention comprises a structure for electrically connecting electronic semiconductor components comprising a first semiconductor substrate having a plurality of layers, at least one of said layers comprising a first electronic semiconductor component. It is preferred that the first semiconductor substrate have at least one conductive column formed therein, the column being adapted to provide an electrical connection to said first electronic component. In the preferred embodiment the structure also includes a second semiconductor substrate having a plurality of layers, at least one of the layers comprising a second electronic semiconductor component. It is preferred that the second semiconductor substrate have at least one via formed therein, the via being adapted to receive the conductive column and provide an electrical connection to the second electronic semiconductor component.

In the preferred embodiment of the structure of the present invention, the first electronic semiconductor component comprises a first semiconductor layer with front end of the line devices and a second semiconductor layer with partial back end of the line devices built through a stud level. It is preferred that the first semiconductor substrate comprise a first electrically insulating layer over said first electronic component, a first electrically conductive layer over said first insulating layer; and a second electrically insulating layer over said first conductive layer, said second insulating layer having said columns formed therein. In the preferred embodiment of the structure of the present invention the second semiconductor substrate comprises a third electrically insulating layer over the second electronic component, a second electrically conductive layer over the third insulating layer; and a fourth electrically insulating layer over the second conductive layer, the fourth insulating layer having the via formed therein.

It is also preferred that in the structure of the present invention the conductive column comprise a layer of a heat flowable electrically conductive metal such as plated solder over a layer of an electrically conductive material such as plated copper. In the preferred embodiment the heat flowable conductive metal has a lower melting point than the layer of a conductive material.

In the preferred embodiment of the structure of the present invention the column is electrically joined to the second conductive layer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
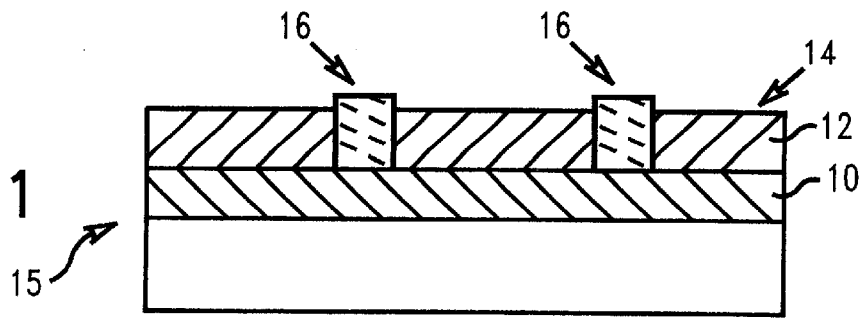
FIG. 1 is an elevational view of a semiconductor structure with front end of the line devices and partial back end of the line devices through a stud level.

In describing the preferred embodiment of the present invention, reference will be made herein to FIGS. 1–6 of the drawings in which like numerals refer to like features of the invention. Features of the invention are not necessarily shown to scale in the drawings.

The joining method of the present invention allows the flexibility of fabricating electronic components, or semiconductor chip structures, to a common point and electrically joining the different parts together, or to a metal wiring level, to complete circuit functionality. Because of the small size of these electronic components or devices, the term "micro-joining" or "micro-connection" may be used to describe the mechanical and electrical interconnections.

In the fabrication of electronic semiconductor components, and in particular, the fabrication of integrated circuits, active components need to be interconnected with wiring in the semiconductor. In the first part of the fabrication process, active and passive components, such as transistors, resistors, capacitors, and diodes etc., are patterned in the semiconductor. This first portion of the fabrication process is commonly referred to as front end of the line ("FEOL") and comprise the semiconductor chip level devices. The chip level devices of the FEOL level are interconnected with wiring on the semiconductor wafer with a back end of the line ("BEOL") process. The BEOL process devices include contacts, insulators, metal levels and bonding sites for chip-to-chip and chip-to-package connections. Generally, a BEOL process device structure will comprise a series of metal wiring layers, each metal wiring layer followed by, or terminating in, a stud or via level. A stud is a conductive path that runs vertically from conductors on one level of a semiconductor substrate to conductors on another level of a semiconductor substrate in a multilayer structure. Generally, there is a plurality of studs on a stud level. Alternatively, a BEOL structure can be built through a "via" level. A via is an opening for electrical interconnection of semiconductor substrate layers in a multilayer structure which functions similar to a stud.

The method and structure of the present invention allows an integrated circuit FEOL device with a partially fabricated BEOL structure to be joined with another BEOL structure of another integrated circuit to form a single structure of a relatively small size. In the prior art, each FEOL/BEOL structure would form a single device or chip. The different chip structures may be joined together for electrical and circuit functionality on a larger wiring substrate using large electrical connections. The present invention allows the electrical connection of a combination of different FEOL chips (different design and/or technology) to a common BEOL chip on a very small scale.

With this invention it is possible to electrically connect and combine a group of electronic components from different families, such as a logic chip and a DRAM chip, onto a common BEOL chip. This electrically connected and combined group of chips becomes, for all practical purposes, one large chip. The micro-joining of these electronic devices enhances "chip" electrical performance due to reductions in resistance and shorter wiring lengths between devices. For example, in Pentium packaging, a logic chip and memory chip may be formed and electrically connected in a single package in order to reduce timing and signal delays that affect high speed performance. The present invention enhances this concept by providing a method and structure to build functional semiconductor chip packages, whether it be DRAM, logic, or some other combination, and then electrically joins them together at a back end level. Instead of packaging different groups of chips onto different substrates and then electrically connecting each substrate together, each group of chips can be formed on a single substrate and electrically joined on a back end wafer.

Generally, in the present invention, a semiconductor structure with completed FEOL devices is fabricated to a predetermined point in the BEOL process. The remainder of the BEOL process is formed on a second substrate and the two substrates are electrically joined together for electrical circuit and component functionality. While the present invention is described in terms of a single completed FEOL device with partially completed BEOL structure and a second BEOL structure, it will be apparent to those skilled in the art that many other combinations of FEOL and BEOL device structures can be joined by the method and structure of the present invention.

As shown in FIG. 1, electronic device 15 comprises a multilayer semiconductor substrate comprising a completed FEOL device structure 10 with a partially built BEOL device structure 12. FEOL device structure 10 may comprise a layer of active and passive electronic components which is electrically connected to partial BEOL device structure 12.

Partial BEOL device structure 12 is built through a stud level and may comprise a wiring substrate. The stud level will be used to electrically connect electronic device 15 to another BEOL or FEOL device to complete circuit functionality. An electrically insulating or dielectric layer 14 is deposited over BEOL device structure 12. The thickness of dielectric layer 14 may be in the range of $0.25\mu$ to greater than $2.0\mu$, but preferably in the range of $0.35\mu$ to $1.2\mu$. The term "structure" as used herein may also be equated with the term "layer." Thus, "FEOL device structure 10" may also be referred to as "FEOL device layer 10", referring to a layer of a multilayer substrate.

Figure 2:
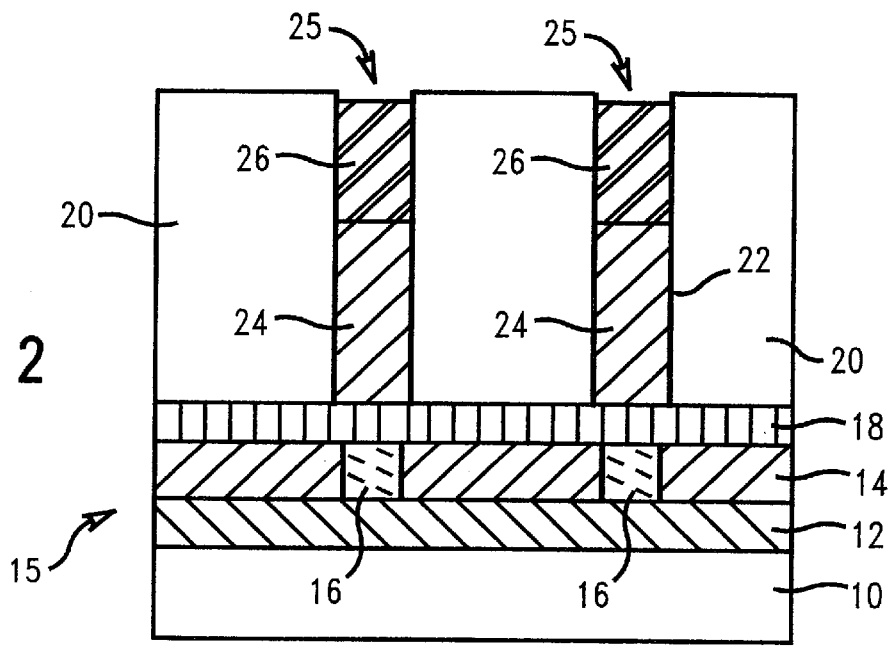
FIG. 2 is an elevational view of the structure of FIG. 1 with conductive columns formed thereon.

As shown in FIG. 2, seed layer 18 is deposited over dielectric layer 14 and stud 16. Seed layer 18 is a conductive material generally adapted for initiating electroplating. A resist layer 20 may be deposited over seed layer 18 and is patterned and developed to form opening 22. Opening 22 is formed at those sites where electrical connections to device 15 will be made and is filled with an electrically conductive material to form column 25. The size of opening 22 and diameter of column 25 may be at least $0.15\mu$ or larger. The height of column 25 may be in the range of $0.50\mu$ to $100\mu$, preferably $1.00\mu$ to $25.0\mu$.

In the preferred embodiment, column 25 comprises a layer 26 of a heat flowable conductive metal such as plated solder, on top of a layer of plated copper 24. The layer of plated solder 26 forms the tip of column 25 and has a lower melting point than the remainder of column 25. Any conventional plating technique may be used to form column 25 over seed layer 18. Column 25 makes an electrical connection to stud 16 through normal multi-level BEOL processing.

Resist layer 20 is removed exposing tip 26 of column 25. A layer 28 of an electrically insulating material, such as polyimide, is deposited over seed layer 18 and around column 25. A protective liner may be deposited over 22 prior to copper plating.

Figure 3:
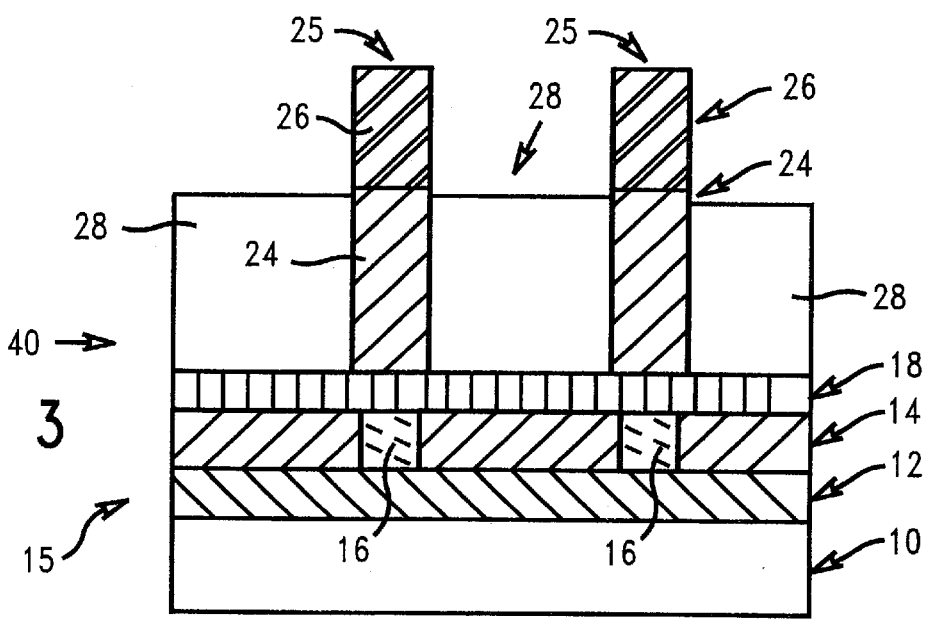
FIG. 3 is an elevational view of the structure of FIG. 1 after exposing the top portions of the conductive columns.

As shown in FIG. 3, insulating layer 28 is recessed, or etched back, to expose tip 26 of column 25. This essentially completes the process of building the electrical connection structure 40 for device 15.

Figure 4:
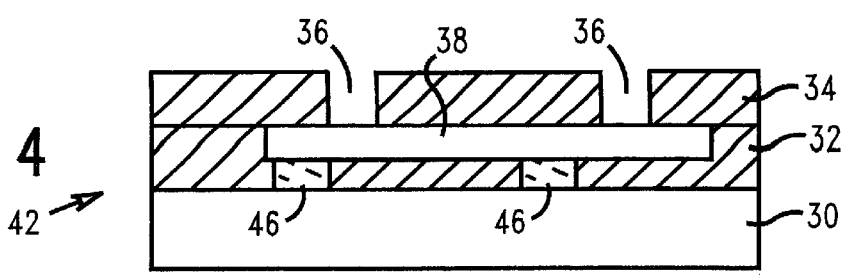
FIG. 4 is an elevational view of a wiring substrate through a via level.

As shown in FIG. 4, electronic device 42 is built through a via level to complete electrical functionality when joined with device 15. Device 42 may comprise a BEOL device structure 30 with electrically conductive mating studs 46 extending therefrom. Electronic device may or may not have an FEOL device structure. In the example shown, electronic device 42 does not have an FEOL device structure. BEOL device structure 30 is a carrier wafer. Device 42 comprises a first electrically insulating layer 32 and an electrically conductive metal layer 38 which is deposited over BEOL wafer 30 and mating stud 46. Metal layer 38 makes electrical contact with mating stud 46 through normal BEOL processing. It is preferred that metal layer 38 be compatible with a heat flowable electrically conductive material such as solder, so that metal layer 38 can be electrically joined to column 25 by soldering. A second electrically insulating layer 34 is deposited over first insulating layer 32. Via 36 is formed in second insulating layer 34 at those sites which form the electrical connection of device 30 to device 15.

Figure 5:
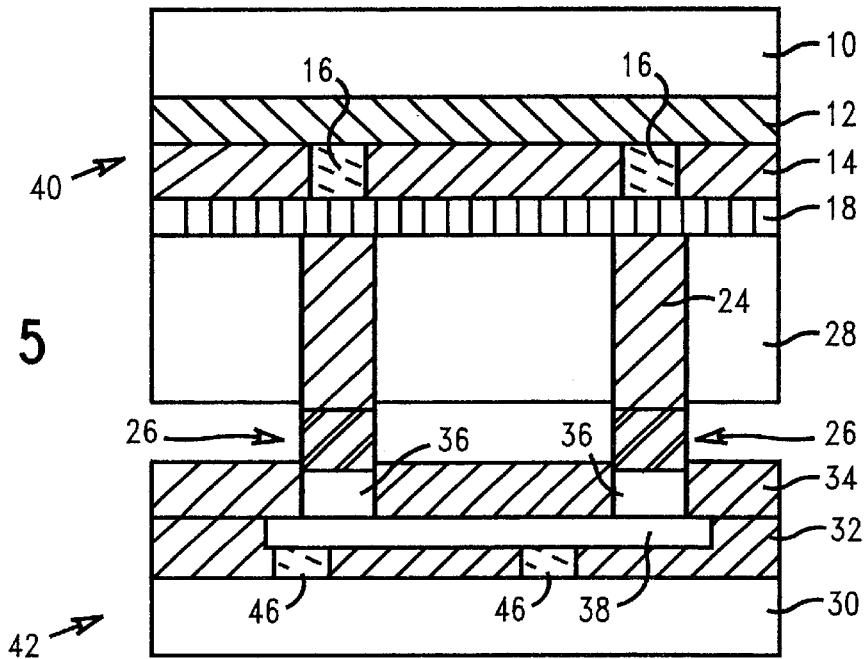
FIG. 5 is an elevational view of the structures of FIGS. 3 and 4 joined together.
Figure 6:
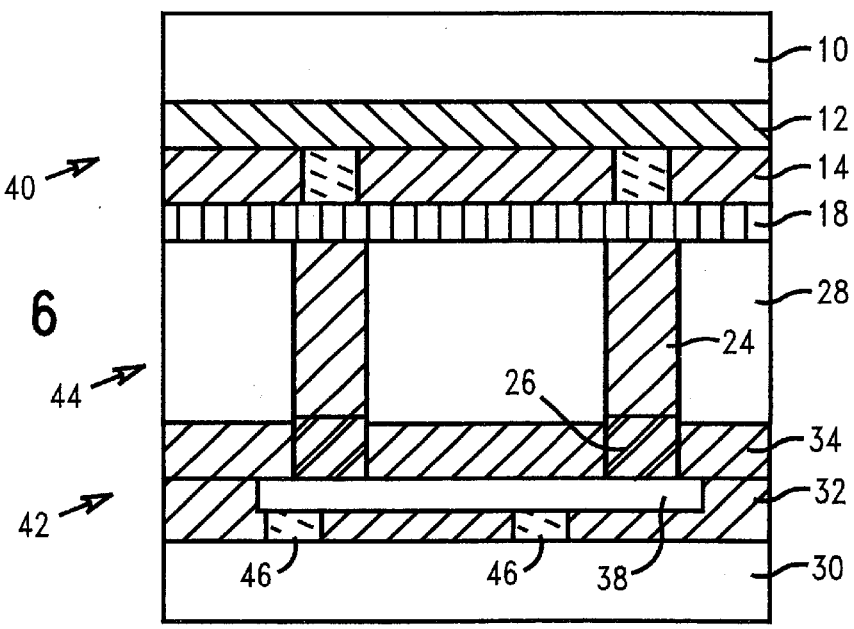
FIG. 6 is an elevational view of the electrically joined structure of FIG. 5.

As shown in FIG. 5, structure 40 is joined to structure 42 by inserting column 25 and tip 26 into via 36 to form device 44. To make an electrical connection between structure 40 and 42, the structure may be compressed fitted together as shown in FIG. 6. In the preferred embodiment, device 44 is heated sufficiently to bond solder tip 26 to metal layer 38 and the surrounding via, to mechanically join the two structures together and provide the electrical interconnection.

The present invention allows the joining of multiple front end chips with a very large back end. Front end chips may be 2"×2", 6"×6", or 10"×10" (50.8×50.8 mm, 152.4×152.4 mm or 254×254 mm), for example with each group of chips performing individual functions.

By fabricating semiconductor chip devices separately, building them to a common level and then electrically joining them together for functionality, very small electrical connections may be made which results in a much smaller overall device size and reduces electrical delay and enhances electrical high speed performance. The small "microjoining" connections and smaller overall device size allows multiple chips from different technologies to be joined together via a common back end for group functionality, while still allowing for rework capability.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of electrically connecting electronic semiconductor components comprising the steps of:

providing a first semiconductor substrate comprising a plurality of layers, at least one of said layers comprising a first electronic semiconductor component, said first semiconductor substrate having at least one conductive column formed thereon, said column electrically connected to said first electronic semiconductor component;

providing a second semiconductor substrate comprising a third electrically insulating layer over a layer comprising a second electronic semiconductor component; a second electrically conductive layer over said third insulating layer; and a fourth electrically insulating layer over said second conductive layer, said fourth insulating layer having at least one via formed therein, said via adapted to receive said column and provide an electrical connection to said second electronic semiconductor component;

inserting said column into said via to join said first semiconductor substrate to said second semiconductor substrate; and electrically connecting said first electronic semiconductor component to said second electronic semiconductor component.

2. A method of electrically connecting electronic semiconductor components comprising the steps of:

providing a first semiconductor substrate comprising a plurality of layers, at least one of said layers comprising a first electronic semiconductor component, said first semiconductor substrate having at least one conductive column formed thereon, said column electrically connected to said first electronic semiconductor component;

providing a second semiconductor substrate comprising a plurality of layers, at least one of said layers comprising a second electronic semiconductor component, said second semiconductor substrate having at least one via opening formed therein, said via opening adapted to receive said column and provide an electrical connection to said second electronic semiconductor component;

inserting said column into said via opening to join said first semiconductor substrate to said second semiconductor substrate; and electrically connecting said first electronic semiconductor component to said second electronic semiconductor component.

3. The method of claim 2 wherein said first semiconductor substrate comprises:

a first electrically insulating layer over said first electronic component;

a first electrically conductive layer over said first insulating layer; and a second electrically insulating layer over said first conductive layer, said second insulating layer having said column formed therein.

4. The method of claim 2 wherein said first electronic semiconductor component comprises a first semiconductor layer with at least one front end of the line device and a second semiconductor layer with at least one partial back end of the line device.

5. The method of claim 4 wherein said second semiconductor layer has at least one electrically conductive stud extending therefrom, said stud adapted to provide an electrical connection to said second semiconductor layer.

6. The method of claim 4 wherein said front end of the line device comprises at least one semiconductor integrated circuit device.

7. The method of claim 2 wherein said second semiconductor component comprises a back end of the line device.

8. The method of claim 7 wherein said back end of the line device is a wiring substrate.

9. A method of electrically connecting electronic semiconductor components comprising the steps of:

providing a first semiconductor substrate comprising a first electrically insulating layer over a layer comprising a first electronic semiconductor component; a first electrically conductive layer over said first insulating layer; and a second electrically insulating layer over said first conductive layer, said second insulating layer having at least one conductive column formed thereon, said column electrically connected to said first electronic semiconductor component;

providing a second semiconductor substrate comprising a third electrically insulating layer over a layer comprising a second electronic semiconductor component; a second electrically conductive layer over said third insulating layer; and a fourth electrically insulating layer over said second conductive layer, said fourth insulating layer having at least one via formed therein, said via adapted to receive said column and provide an electrical connection to said second electronic semiconductor component;

inserting said column into said via to join said first semiconductor substrate to said second semiconductor substrate; and electrically connecting said first electronic semiconductor component to said second electronic semiconductor component.

10. The method of claim 9 wherein said conductive column is electrically joined to said second conductive layer.

11. The method of claim 9 wherein said conductive column comprises a first layer of a conductive material covered by a layer of a heat flowable electrically conductive material having a lower melting point than said first layer of a conductive material.

12. The method of claim 11 wherein said first electronic semiconductor component is electrically connected to said second electronic semiconductor component by heating said joined structure sufficiently to flow said heat flowable conductive material.

13. The method of claim 11 wherein said first layer of conductive material is plated copper.

14. The method of claim 11 wherein said heat flowable conductive material is plated solder.

15. A structure for electrically connecting electronic semiconductor components comprising:

a first semiconductor substrate having a plurality of layers, at least one of said layers comprising a first electronic semiconductor component, said first semiconductor substrate having at least one conductive column formed therein, said column adapted to provide an electrical connection to said first electronic component;

a second semiconductor substrate having a plurality of layers, at least one of said layers comprising a second electronic semiconductor component, said second semiconductor substrate having at least one via opening formed therein, said via opening adapted to receive said conductive column and provide an electrical connection to said second electronic semiconductor component.

16. The structure of claim 15 wherein said first electronic semiconductor component comprises a first semiconductor layer with front end of the line devices and a second semiconductor layer with partial back end of the line devices built through a stud level.

17. The structure of claim 15 wherein said first semiconductor substrate comprises:

a first electrically insulating layer over said first electronic component;

a first electrically conductive layer over said first insulating layer; and a second electrically insulating layer over said first conductive layer, said second insulating layer having said columns formed therein.

18. The structure of claim 15 wherein said conductive column comprises a layer of a heat flowable electrically conductive metal over a layer of an electrically conductive material, said heat flowable electrically conductive metal having a lower melting point than said layer of an electrically conductive material.

19. The structure of claim 18 wherein said heat flowable conductive metal is plated solder and said layer of an electrically conductive material is plated copper.

20. A structure for electrically connecting electronic semiconductor components comprising:

a first semiconductor substrate having a plurality of layers, at least one of said layers comprising a first electronic semiconductor component, said first semiconductor substrate having at least one conductive column formed therein, said column adapted to provide an electrical connection to said first electronic component; and a second semiconductor substrate having a third electrically insulating layer over a layer comprising a second electronic semiconductor component; a second electrically conductive layer over said third insulating layer; and a fourth electrically insulating layer over said second conductive layer, said fourth insulating layer having at least one via formed therein, said via adapted to receive said conductive column and provide an electrical connection to said second electronic semiconductor component.

21. The structure of claim 20 wherein said column is electrically joined to said second conductive layer.

* * * * *